June 29, 1965 J. HILL 3,191,280

APPARATUS FOR ASSEMBLING SEMI-CONDUCTOR DEVICES

Filed April 23, 1963 3 Sheets-Sheet 1

INVENTOR.
JOHN HILL
BY
Blair and Buckles
ATTORNEYS

June 29, 1965 J. HILL 3,191,280

APPARATUS FOR ASSEMBLING SEMI-CONDUCTOR DEVICES

Filed April 23, 1963 3 Sheets-Sheet 2

INVENTOR
JOHN HILL
BY
Blair and Buckles
ATTORNEYS

June 29, 1965 J. HILL 3,191,280

APPARATUS FOR ASSEMBLING SEMI-CONDUCTOR DEVICES

Filed April 23, 1963 3 Sheets-Sheet 3

INVENTOR.
JOHN HILL
BY
Blair and Buckles
ATTORNEYS

United States Patent Office 3,191,280
Patented June 29, 1965

3,191,280
APPARATUS FOR ASSEMBLING SEMI-CONDUCTOR DEVICES

John Hill, Wakefield, Mass., assignor to National Transistor Manufacturing Company, a division of International Telephone and Telegraph Company, Lawrence, Mass., a corporation of Massachusetts Filed Apr. 23, 1963, Ser. No. 275,070
6 Claims. (Cl. 29—203)

This invention relates to an apparatus for use in the automated assembly of semi-conductor devices.

More particularly, it relates to a mechanism capable of reproducibly embedding an electrode into the semi-conductive element of a semi-conductor device with extreme accuracy or more particularly, within a very close tolerance of less than $\pm\frac{1}{2}$ of $\frac{1}{100,000}$ of an inch and which is capable of accomplishing this automatically and at economical or high production line speeds.

The manufacture of semi-conductor devices as herein concerned is distinguished by the requirement of economy coupled with the need for extreme accuracy in every aspect of production. As is well known, the electrical properties of a particular semi-conductor device are entirely dependent upon the mechanical and physical-chemical properties of that device. The device itself requires a crystal or wafer of a semi-conductive material such as germanium or silicon in a high state of purity and which has been "doped" by the addition of carefully controlled trace amounts of other metals, sometimes referred to as impurities, which act either as donor or acceptor materials and which may be, for example, phosphorous, arsenic or antimony in the case of donor materials and boron, aluminum, gallium or indium in the case of acceptor materials. It will be understood that both the purity of the crystal and the quantity and distribution of the impurities are critical to the electrical characteristics of the device.

The location and the nature of the electrical contacts applied to the wafer are also critical. Before contact is made, the surfaces of the wafer must be carefully cleaned and etched to avoid any trace of oxide or other undesirable impurities which could interfere with the flow of electricity. If the wafer or crystal is pre-doped with the desired impurities, the wafer must be carefully oriented and the contacts made in exactly the right areas.

With these requirements, the preparation and assembly of semi-conductor devices has heretofore been a painstaking, tedious task involving a great deal of extremely close hand work and attended, despite extreme care, by an extraordinarily high spoilage rate. The electrical characteristics, even among those devices which turned out to be operable, were for the most part uncontrolled, so that as devices were made they had to be tested for and classified according to their electrical characteristics, and then inventoried until such time as a demand for a device having the particular characteristics manifested itself.

A major contribution toward permitting the automated assembly of such devices was the discovery that the doping of the semi-conductor material with the desired impurities and the production of an excellent contact could be accomplished simultaneously by employing for the contact material an alloy of a metal which itself is alloyable with the semi-conductor material and the desired impurities, and welding the contact material with the semi-conductor material by passing a relatively heavy current through the assembly. This method of manufacture of semi-conductor devices is explained in Pfann Patent No. 2,792,538, to which reference is also made for specific disclosure of the variety of semi-conductor devices that can be made in this way, and of the variety of materials than can be used for the purpose.

Using this technique, it is possible to employ uniform wafers or crystals which may be either of a pure semi-conductor material or uniformly of a P or N conductivity type, thereby eliminating the need either for orienting the wafer in the device or for predetermining the desired point of contact. At the same time, the quality of the contact is improved since the contact weld is of substantial depth in the semi-conductor material, and since the quantity of desired impurity to be introduced can be accurately controlled by controlling the quantity of impurity in the contact metal in the weld area.

The quantity of impurity introduced in the region of the contact is dependent on four factors; namely, the percent of impurity alloyed in the metal of the contact wire, the thickness of the wire, the pressure with which the wire initially contacts the surface of the semi-conductor material, and the amount of current used to make the weld.

The chemical composition of the semi-conductive wafer and of the alloy of the contact wire may be controlled to great accuracy. Similarly, the contact wire may be drawn with extreme accuracy down to very small diameter. Further, it is known to control the amount of welding current that passes through the semi-conductor assembly to within extremely close limits.

But the controlling of the pressure with which the wire is initially made to contact the surface of the wafer of semi-conductive material to the same high precision as attained with respect to the other three factors has presented a problem of extreme difficulty in the manufacture of semi-conductor devices such as here concerned, but upon the solving of which is absolutely dependent the manufacture of those devices in economical or automatic manner.

This invention will be fully understood from the following description taken together with the accompanying drawings in which.

The invention will be described and shown with reference to the assembly of a diode, and with reference more particularly to a diode in which the semi-conductive material comprises 99.8% plus pure germanium, and in which the contact wire comprises an alloy of 98% gold and 2% arsenic. But it is understood that other semi-conductive materials and other contact materials may be substituted, and that the procedures to be described can be used as well for other semi-conductor devices varying in size and construction, such changes being a mere matter of choice or convenience.

The exemplary germanium diode is assembled in two pieces which will be referred to respectively as the base and the insert.

Figures 1, 2:
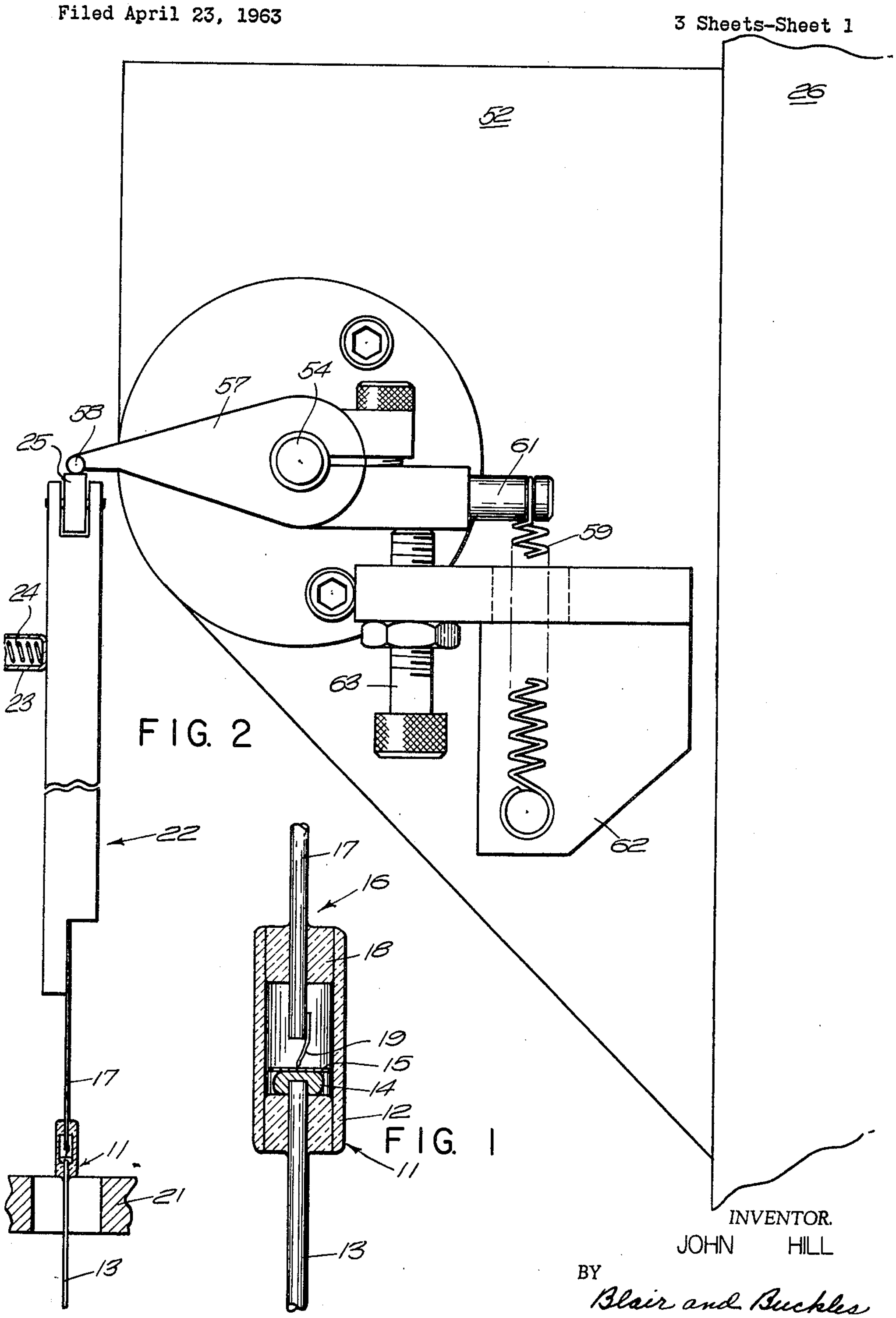
FIG. 1 is a side view of a semi-conductor device of the type described, enlarged to about 13 times actual size.
FIG. 2 is a side view showing the assembly of the device with the invention apparatus.
Figure 3:
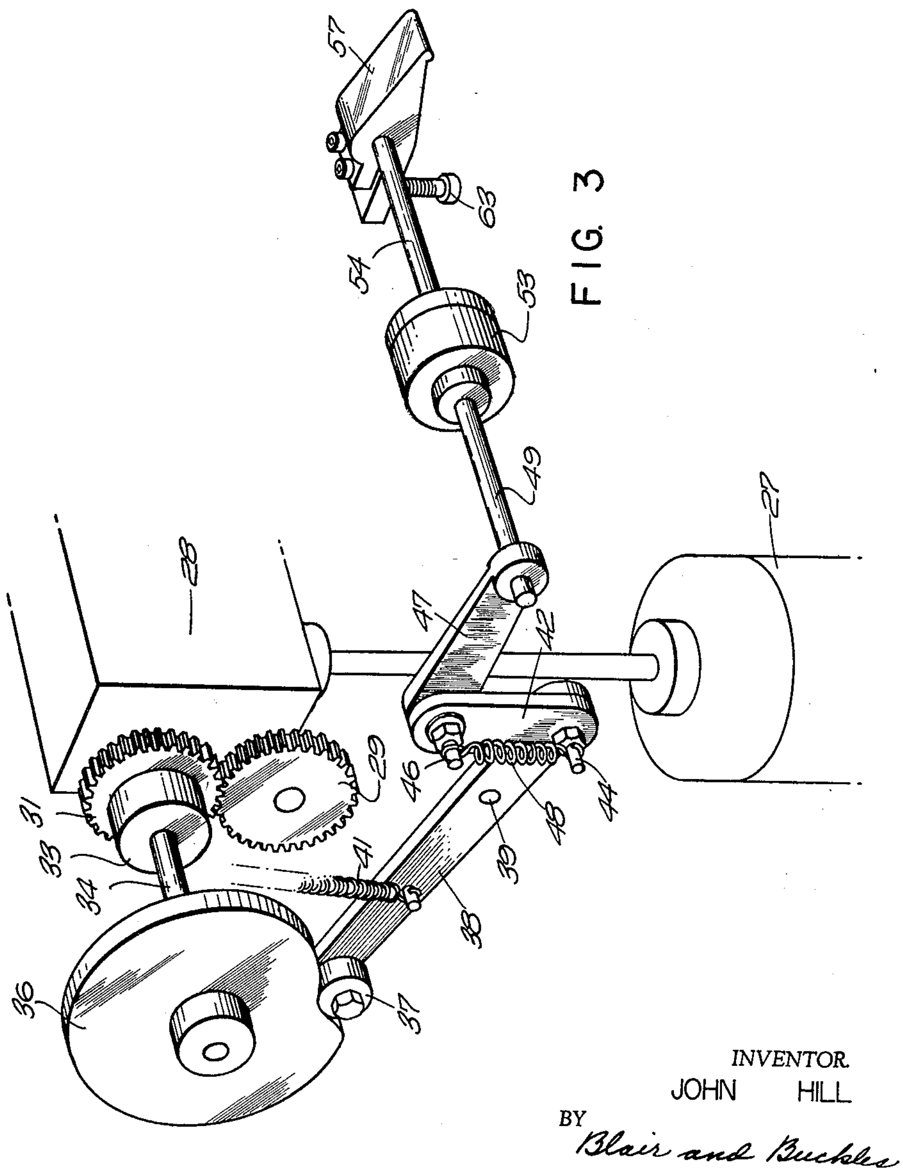
FIG. 3 is a diagrammatic perspective view of the drive elements of the insert positioning apparatus.
Figure 4:
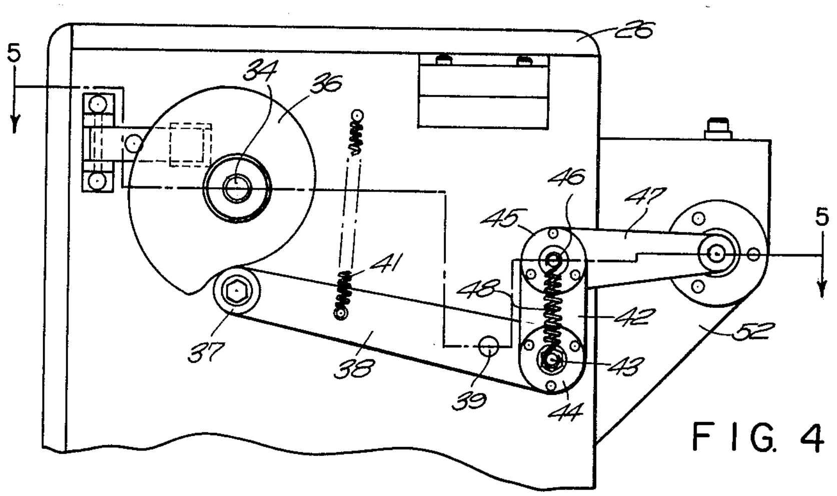
FIG. 4 is a side elevation of the apparatus of FIG. 3.
Figure 5:
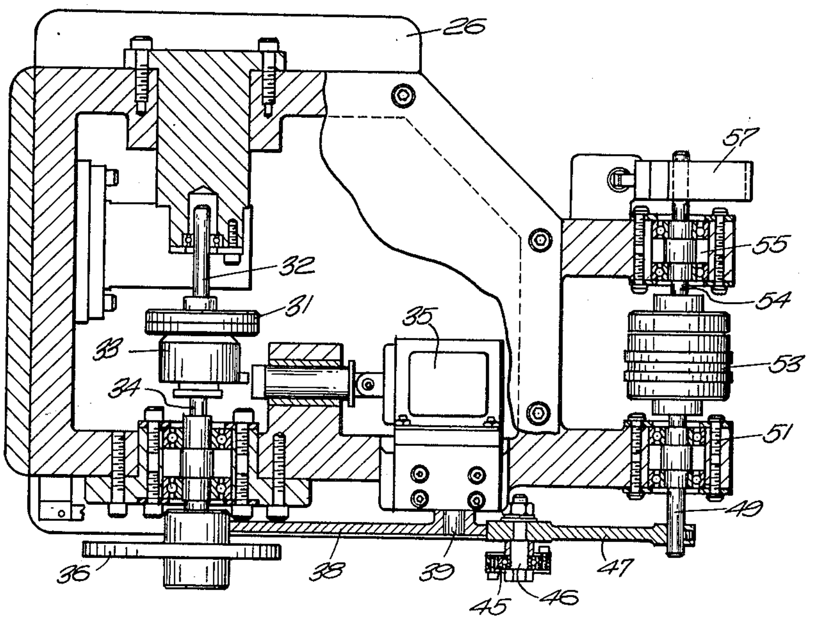
FIG. 5 is a top view of the same apparatus.

In FIG. 1, the base is indicated generally at 10 and to comprise a glass envelope 11, a glass bead 12, lead wire 13, a solder wafer 14, and a germanium crystal 15; and the insert is indicated generally at 16 and to comprise lead wire 17, glass bead 18, and wire whisker 19.

In the manufacture of the diode there is selected for the base lead 13 a wire having a diameter of about 0.025 inch and which is cut to a length of about $1\frac{21}{72}$ inches, and with its ends made straight and square. The glass tube or envelope 11 which is sealed to one end of the wire 13 is about 0.250 in. long and has an outside diameter of about 0.095 in., and an inside diameter of about 0.075 in., and is positioned in such a manner that the end of the wire protrudes through the glass seal or lead 12 a distance of about 0.010 in., and such that the body of the tube extends oppositely of the wire and in parallelism therewith. The base portion 10 is then fixed in a vertical position with the glass envelope 11 extending upwardly and the free end of the wire extending downwardly, and the solder wafer 14, formed to a diameter of about 0.060 in., and a thickness of about 0.002 in., is inserted therein. With the proportional dimensions as described the wafer of solder will lie flat against the flat end of the wire. A germanium wafer 15 of about 0.05 sq. in. area and about 0.002 in. thickness is then deposited on top of the solder. The geometry is again such as to permit the wafer of germanium to rest on the wafer of solder. And the germanium wafer being, at this point, uniform chemically, may be placed with either side up.

A weight with square ends having a diameter just slightly less than the inside diameter of the glass envelope is next inserted in the glass envelope 11 to press the germanium wafer 15 against the solder wafer 14 and in turn the solder wafer 14 against the wire 13. The assembly is then heated in an oven to melt the solder and thereby to attach the germanium lead wire 13. Upon removal of the apparatus from the oven, and withdrawal of the weight, the base portion 10 is ready for further assembly.

A wire element about 0.020 in. in diameter and about $1^{21}/_{32}$ in. in length with square cut ends is selected for the lead 17 of the insert portion 16. The glass bead 18 is about 0.060 in. in diameter and 0.065 in. in length, and is sealed to lead wire 17 in such a manner that about 0.060 in. of the wire extends beyond the bead. The fine wire or whisker 19 is of about 0.002 in. in diameter, is formed from a gold-arsenic alloy, and is welded to the side of the lead wire 17 at the extremity of the wire portion which protrudes beyond the bead.

The gold wire 19 extends beyond the end of the lead wire 17 for a distance of about 0.050 in., and its free end is accurately cut at about a 45° angle whereby it will make a point contact with germanium wafer 15. Further, the gold wire is reversely bent so that its free end parallels and is coaxial with the lead wire 17.

For the automatic assembly of the described semi-conductor device there may be employed a multi-holder machine wherein holder pairs are arranged on the periphery of an intermittently rotating turret and are brought successively to the several work stations, and wherein the holder pairs may consist each of a base holder and a vertically slidable insert holder arranged directly thereabove. In FIG. 2 a base holder of such pair is generally indicated at 21 and the insert holder is generally indicated at 22.

Th base holder 21 is designed to receive and retain in a fixed vertical position the base 10 with the lead wire 13 down and the envelope 11 up. The insert holder 22 is designed to receive and retain the insert in fixed vertical orientation and with the whisker 19 facing down and the lead 17 facing up. The holder 22 is mounted for vertical reciprocation along its axis and is positioned above holder 21 such that insert 16 and base 10 lie on a common vertical axis.

A friction brake mechanism, diagrammed as a housing 23 and spring 24, engages insert holder 22 with a strength sufficient to require an appreciable force, say of at least about five pounds, to move the insert holder in either direction, thereby preventing any unintended movement of the insert holder as a result of vibration or the like.

The base 10 is inserted in the base holder 21 and the insert 16 is inserted in the insert holder 22 at an assembling machine station previous to that herein concerned, and at which the insert holder is vertically spaced a predetermined distance above the base holder. During insertion, the base body is indexed relative to the end of the wire 13 and the insert relative to that end of the glass bead 18 remote from the gold wire tip, and both diode pieces are then clamped or otherwise fixed in their respective holders.

The top of insert holder 22 is provided with a cam wheel 25, FIG. 2, which engages an inclined track (not shown) on the assembling machine, and which upon rotation of the turret forces holder 22 down toward body holder 21 until insert 16 is positioned within base 10. The extent of this entry is carefully controlled so that within tolerance limits gold wire 19 cannot engage germanium wafer 15.

As the turret rotates, each holder pair is successively brought to the station herein concerned, and shown in FIG. 2. At this station insert holder 22 is depressed a predetermined distance past (closer to the base holder 21 than) the spacing at which the tip of the gold wire contacts the surface of the wafer. Following this positional manipulation the holders are advanced to a station where a predetermined current is passed through the thus assembled semi-conductor device. Base holder 21 is provided with a heater (not shown) which surrounds glass envelope 11 and when actuated first seals the glass bead 18 to glass envelope 11 and thereafter anneals the glass in the assembly, the timing of this being controlled to effect the sealing of the bead to the envelope as soon as the wire 19 has been welded to the wafer 15. Completing the automatic diode assembly operation as herein concerned, subsequently in the cycle of rotation of the assembling machine turret, the heater associated with a particular holder pair is turned off, the glass allowed to cool, the base holder released, the insert holder withdrawn and the assembled and sealed semi-conductor device removed from the insert holder.

For economical operation, a diode assembling machine such as here concerned may have fifty pairs of holders, and may be regulated to advance the pairs one station every 2.5 seconds or so as to assemble 24 semi-conductor devices a minute. The machine will operate continuously and to allow, say, a total time of about two minutes for the assembly of each diode.

In the described depressing of the insert 16 towards the base 10 the fine wire 19 is forced against the surface of the semi-conductive wafer 15 under a pressure which, since the wire is a spring, may be regulated by controlling the degree of over-travel past the initial contact of the wire with the surface of the wafer. In the heating or welding of the parts this pressure will of course be relieved by the embedding or flow of metal from the wire into the wafer or weld. Accordingly, for any given current used in making the weld, the quantity of metal forming the weld is determined directly by the pressure on, or amount of bend imposed in, the contact wire. Since as above indicated the impurity (acceptor or donor) is alloyed in the wire, and since as just mentioned the quantity of metal in the weld is dependent on the pressure on the wire, the electrical characteristics of the semi-conductor device are, then, a function of the over-travel of the insert past the point of initial contact of the wire 19 with the wafer 15.

Accordingly, the amount of travel applied to the wire after the initial contact has been made must be controlled to an extremely high degree of precision or accuracy and also reproducibility. A sufficiently accurate control, it will be understood, cannot be achieved merely by controlling the distance between the free ends of the two lead wires, as by depressing the insert holder to a predetermined distance above the base holder. For one thing, despite the most careful control of the manufacture of the parts, and the use in that of precision automatic machinery, the length of the lead wires will vary to an irreducible minimum of plus or minus a few thousandths of an inch. So also there will be some variation in the thickness of the solder wafer and of the semi-conductor wafer. Yet another inescapable source of variation or tolerance is in the length and placement of the contact wire at the end of the insert lead, and as well in the placement of the glass bead on the insert lead and the glass envelope on the base lead. A still further source of variation is in the effective length of the insert holder and in the placement of the base in the base holder and of the insert in the insert holder.

The totaling of all these possible errors yields a cumulative tolerance of plus or minus about 0.020 in. In other words, were the machine to be adjusted so that the insert holder 22 would be depressed, in the average of all instances, just to engage the tip of wire 19 with the surface of wafer 15, there would in some instances be a gap between the tip of the wire and the surface of the wafer of up to 0.020 in., and there would in other instances be an over-travel after initial contact of up similarly to 0.020 in.

Under this invention there is utilized a different mode of operation whereby the machine is set up initially to bring the tip of wire 19 to an average distance of about 0.025 in. from the surface of wafer 15, or such that within the $\pm0.020$ tolerance the wire tip may be as close as 0.005 in. to as far as 0.045 in. from the surface of the wafer. Thereafter the insert holder is depressed at a slow and constant rate, the contacting of the wire with the surface of the semi-conductive wafer is sensed electrically, and the slow constant-rate insert advance is thereafter continued for a predetermined period of time.

In other words, in order to obtain a constant degree of over-travel of and therefore a constant pressure on and uniform welding of the contact wire from diode to diode, there is herein utilized a time-dependent control of the insert advance.

It will be understood that there are available for this purpose electrical control devices which can measure and reproduce intervals of time to within an accuracy of less than one millisecond. More particularly, the known and suitable electrical timing devices are triggered by an electrical signal, which will run for a predetermined period of time measured in milliseconds ($1/1000$ of a second) and will, at the end of the predetermined period, make or break an electrical circuit with an error of less than one millisecond in the total time interval measured.

But with electrical control of the time interval there is still required a mechanical control of the insert position, in that the stated mode of achieving a desired pressure on the contact wire necessitates, for its reproducing from semi-conductor device to semi-conductor device, the mechanical advancing of the insert 22 at an absolutely uniform rate, and also the mechanical interruption of the depressing of the insert following insert advance of absolutely uniform extent.

But this may not be accomplished with the available devices for advancing the work, or for making or breaking a mechanical linkage, for they are characterized by very much less accuracy and reproducibility than the mentioned electrical devices for controlling time intervals.

More particularly, the time these positioning devices require to make or break a mechanical linkage, or to start or stop a mechanical motion, is on the order of many milliseconds, and unless extreme care is taken in the design of such devices, the time required will vary by many milliseconds from cycle to cycle.

This is especially true of friction clutches or brakes. For example, in a typical quick acting magnetic brake or clutch, a period of 5 to 10 milliseconds is required after the clutch actuating current is turned off before the magnetic field will decay sufficiently for the clutch to release. A similar period of time is required to actuate the brake or clutch initially when the current is first applied.

It will be appreciated still further that the errors inherent in these mechanical position control devices, or devices for making or breaking a mechanical linkage, are increased substantially, and also non-reproducibly, if the device has any appreciable inertial forces.

Under this invention time dependent positioning with the accuracy of the electrical control devices is made possible by the provision of new and improved mechanical apparatus affording an absolutely uniform motion, a simple and direct reset mechanism, and a simple and direct means for disconnecting the drive upon the expiration of the predetermined time interval. Also, inertial forces are kept to a minimum by design of the apparatus so that the insert holder 22 is depressed through the largest possible fraction of, or in other words at the lowest rate permitted by, the time interval that the particular holder pair is at the particular station. In addition, the apparatus is protected against damage by non-actuation of the timer, as may result from either the base piece or the insert piece being missing or defective. Further, the apparatus has a continuous cyclical operation, with say, a 330° working cycle and a 30° reset cycle whereby it will reset itself at the end of each cycle whether or not timing contact is made.

The apparatus is herein shown to comprise a base 26 on which is mounted constant speed synchronous motor 27 which actuates reduction gear 28. Output gear 29 of reduction gear 28 engages gear 31 mounted on shaft 32. Shaft 32 drives one turn clutch 33 which, when engaged, drives in turn shaft 34. One turn clutch 33 is actuated, or made to engage, by solenoid 35.

Shaft 24 drives spiral cam 36, and that in turn positions cam roller 37. Cam 36 is carefully contoured with a spiral surface so that at all positions during its rotation (except for the return section which is kept to the minimum) $\Delta r$ is proportional to $\Delta\theta$ where $r$ equals the distance from the center of rotation of the cam to its periphery at any given point and $\theta$ is the angular displacement of the cam. Thus with a constant velocity of rotation for the cam 36, a uniform linear movement is imparted to cam roller 37.

The movement of the cam roller 37 is transmitted to insert holder 22 through a reducing linkage as will now be described.

Cam roller 37 is mounted at one end of crank 38 which in turn is pivoted on a fulcrum 39. Cam roller 37 is pulled against the surface of cam 36 by a spring 41 which is stretched between base 26 and crank 38. The other end of crank 38 beyond fulcrum 39 is attached to a link 42 by a connecting rod 43 carried through a bearing 44 mounted on link 42. At its other end the link 42 has a similar bearing 45 through which is mounted a rod 46 which connects the link to one end of crank arm 47. Spring 48 is stretched between the protruding portions of rods 43 and 46 to damp any play in the linkage.

At its other end crank arm 47 receives shaft 49 which is supported by bearing 51 mounted in extension 52 of base 26. Magnetic clutch 53 is mounted with one end on shaft 49 and with the other end on shaft 54 which is supported in bearing 55 mounted in extension 52 of base 26.

Depressor piece 57 is mounted on the end of shaft 54 and terminates in contact knob 58 designed to engage wheel 25 mounted on the top of insert holder 22 as shown in FIG. 2. Spring 59 is stretched between rearward extension 61 of depressor piece 57 and bracket 62 on extension 52 of base 26, and it therefore biases contact knob 58 upwardly.

In the exemplary apparatus, spiral cam 36 is so fashioned that cam roller 37 is depressed 0.750 in. during about fifteen/sixteenths of a single rotation of the cam, the remaining one sixteenth of the single rotation being taken up by the return of cam roller 37 to the starting position. The distance between the center of cam roller 37 and center of fulcrum 39 is 4 inches, and that between the center of fulcrum 39 and the center of connecting rod 43 is one inch. And the distance between the fulcrum 46 and shaft 49 is 2½ inches, and that between the center of shaft 54 and contact knob 58 is one inch. Thus the linkage acts to reproduce in the contact knob 58 exactly $\frac{1}{10}$ of the motion imparted to cam roller 37 by cam 36. In other words, if cam roller 37 is depressed 0.500 in. by the cam 36, contact knob 58 and hence insert holder 22 will be depressed 0.050 in.

Fine adjustment screw 63 is threaded through bracket 62 and engages the underside of rearward extension 61 of depressor piece 57 for precise positioning of contact knob 58 subject to its raising or retracting by spring 59.

The adjustment of screw 63 is to position retracted knob 58 so that it will just or barely contact each successive roller 25 as each successive holder pair is brought into position.

It will be understood that clutch 33 is so adjusted that each rotation of cam 36 starts and stops at the position where cam roller 37 is at the minimum distance from the center of rotation of cam 36.

In the operation of the apparatus, motion of the turret causes base holder 21 to actuate a switch (not shown) that energizes solenoid 35 and magnetic clutch 53. This connects the pressor piece 57 to the positioning linkage and starts cam 36 rotating responsive to the energizing also of motor 27, the speed of whose rotation is reduced at gear 28 such that a period of 2.3 seconds is required for one complete rotation of the cam.

A timer (not shown) is electrically connected through base holder 21 and insert 22 in a circuit which is completed upon contact of wire 19 with wafer 15, to actuate the timer. Any conventional millisecond timer may be employed which is capable of being adjusted readily to measure varying elapsed periods of time, and which, upon being actuated, will run for a predetermined adjustable period of time, then actuate a circuit which disconnects the current to clutch 53, and then reset itself.

As soon as the actuating current to magnetic clutch 53 is disconnected, the magnetic field in the clutch begins to decay. When the magnetic field in clutch 53 has decayed sufficiently that the force exerted by the clutch on shaft 54 is insufficient to overcome the counter force applied on rearward extension 61 of depressor piece 57 by spring 59, pressor piece 57 is returned to its initial position of contact of extension 61 with fine adjustment screw 63 and whereby contact knob is lifted out of contact with roller 25. In the particular apparatus, the delay between the time when the actuating circuit to clutch 53 is disconnected and when pressor piece 57 is released to return to its initial position is almost exactly 5 milliseconds, and this delay is constant within a few tenths of a millisecond from cycle to cycle. It will be understood that an allowance for this time delay due to the period of decay of the magnetic field in magnetic clutch 53 is made when the timer is set for the total desired elapsed time.

Following the extremely precise overtravel positioning of the insert 22 and thereby of the gold wire 19 as just described, the diode assembly is advanced to a subsequent turret station at which, by passing through it a predetermined current, the wire 19 is welded to the wafer 15, all as hereinbefore mentioned.

In the event that the circuit between base holder 21 and insert holder 22 is not completed, as when there may be no or a defective semi-conductor device in the holder pair, the pressor piece 57 is raised to approximately its initial position when cam 36 completes its rotation and cam roller 37 returns to its starting position. Since, however, there is a delay in the build up of the magnetic field in clutch 53 when the current in the clutch is first turned on, the return of cam roller 37 may not cause pressor piece 57 to return exactly to its initial position. For this reason an auxiliary switch, (not shown) is provided and arranged to disconnect the current to clutch 53 and reset the timer in the event that the device goes through a complete cycle without there having been a timing contact through the holder pair.

The time required for one complete rotation of cam 36 is purposely less than the frequency of the intermittent rotation of the turret, so that under all circumstances the pressor piece 57 will have returned to its initial position when the next succeeding holder pair is rotated into position. It will be understood that the use of one turn clutch 33 prevents the building up of a cumulative timing error over a period of operation. It should be noted also that the delay in the build up of the magnetic field in magnetic clutch 53 when the clutch is first actuated can be ignored during normal operation since the critical period in the operation begins when wire 19 first contacts wafer 15 and this time of contact under normal operation always occurs after clutch 53 is in full engagement and the pressor piece 57 has rotated for some measurable period.

As indicated above, the interval of time between the instant that wire 19 first contacts wafer 15 and the instant that the pressor piece 57 is released from contact with roller 25 is reproducible to within less than one millisecond. In the particular apparatus, one complete revolution of the cam requires 2.3 seconds and during $\frac{1}{16}$ of the cam's rotation, cam follower 37 is depressed a total distance of 0.750 in. The total time interval for this 0.750 in. movement is approximately $\frac{21}{50}$ millisecond so that cam follower 37 is depressed about 0.00035 in. per millisecond. Since the motion of cam follower 37 is ten times that of contact knob 58, knob 58 and therefore insert holder 22 is depressed about 0.000035 in. per millisecond. Since the timing cycle is accurate within one microsecond, the amount of overtravel tending to press wire 19 into wafer 15 is reproducible to an accuracy greater than $\pm\frac{35}{100,000}$ inch.

As a result of this extreme accuracy, the quantity of the impurity metal introduced into the wafer of semi-conductor material by the welding technique is substantially constant from semi-conductor device to semi-conductor device. Therefore the variation in electrical characteristics of successive devices due to variation in the quantity of trace impurities introduced from the weld has for practical purposes been eliminated.

In extensive production runs it has been found that yields of better than 95 percent of semi-conductor devices having the desired electrical characteristics within normal allowable tolerance limits can be obtained when the described apparatus is used. This is a very great improvement upon the best yields of substantially less than 50 percent which have heretofore been obtainable, whether the assembly of the semi-conductor device be by hand, as with a micrometer, or automatically, as with any known reverse cycling or reciprocating device suited for producing the necessary overtravel of the wire 19 toward wafer 15.

I claim:

1. In a machine for assembling a first and a second work piece said first work piece including a body element and said second work piece terminating in a resilient element adapted to contact said body element which includes an intermittently rotating generally circular work table, a plurality of first work piece holding stations arranged on the periphery of said table, a plurality of vertically reciprocating second work piece holding stations each arranged above one of said first work piece holding stations and adapted to retain a second work piece in axial alignment with the first work piece retained in each of said first work piece holding stations, said table adapted to bring said work piece holding stations successively to a succession of stationary work stations arranged around said table, means associated with one of said work stations for depressing said vertically reciprocating second work piece holding stations to the extent that said resilient member of the second work piece retained in said station is impressed a predetermined amount against the body of the first work piece retained in the corresponding first work piece holding station which comprises, a lever arm mounted on a shaft and adapted to contact the end of said first work piece holding; drive means for rotating said shaft at a predetermined constant speed; disconnect means including a clutch for disconnecting said shaft from said drive means; tension means cooperating with said shaft and said lever arm for returning said lever arm to its initial position when said shaft is disconnected from said drive means, detector means for detecting the instant of contact between said resilient member and said body, and timer means actuated by said detector means for disconnecting said clutch after the lapse of a predetermined length of time.

2. The machine as claimed in claim 1 wherein said disconnecting means comprises a magnetic clutch.

3. The machine as claimed in claim 2 wherein the drive means includes a spiral cam, means for rotating said spiral cam at a constant predetermined rate, a cam follower cooperating with said cam, said cam follower including a lever connected through a linkage to the input side of said clutch.

4. The machine as claimed in claim 3 wherein said cam includes a return section and wherein the means for rotating said cam includes a one-turn clutch adapted to stop the rotation of said cam as soon as said cam follower has passed over said return section.

5. The machine as claimed in claim 4 wherein said one-turn clutch and said magnetic clutch are both energized when a work piece holding station comes into position in said stationary work station.

6. For use in the method of assemblying semi-conductor devices wherein a body of semi-conductive material contained in a base element is contacted by a fine wire connector contained in an insert element said wire connector comprising a major metallic ingredient and a small quantity of conductivity type determining impurity selected from the group consisting of acceptors and donors; wherein the wire conductor is pressed against the body at a predetermined pressure resulting from the advance of the wire toward the body for a predetermined distance after the initial contact between the tip of the wire and the body is made and wherein the connector is fused into said body and said impurity contained in said connector diffused into said body by the passage of current through said body and said connector, the quantity of said diffused impurity being determined by the pressure with which said connector contacts said body; apparatus for accurately controlling the distance of advance of said wire after said initial contact which comprises means for holding said base element and said insert element in axial alignment, at least one of said means being movable along the axis of said alignment, pressor means mounted on a shaft, said pressor means contacting said movable holding means and adapted to advance said holding means from a predetermined initial position toward the other of said holding means, a drive system for advancing said pressor means at constant speed, said drive system including a constant speed synchronous electric drive motor, a cam driven by said motor, a crank pivoted intermediate its ends on a fulcrum and mounting at its longer arm a follower bearing against said cam, a link pivotally connected to the shorter arm of said crank, and a crank arm pivotally connected to said link and to said pressor shaft, said crank, lever and crank arm comprising a linkage for reducing by several times the motion transmitted to said follower by said cam, electrically actuated means for making and breaking driving connection betwen said crank arm and pressor with a variation in time of less than one millisecond, electrical circuit and timer means for detecting the bringing of said connector into contact with said body and for controlling said electrically actuated means to break said driving connection upon the expiry of a predetermined adjustable period of time after said contact of said connector with said body, and means for returning said pressor means to said predetermined initial position toward the other of said holding means upon said breaking of said driving connection.

References Cited by the Examiner

UNITED STATES PATENTS

| | | | |
|---|---|---|---|
| 2,365,147 | 12/44 | Speller | 78—48 |
| 2,373,619 | 4/45 | Vajda | 192—125 |
| 2,387,478 | 10/45 | Tiffany | 192—125 |
| 2,757,440 | 8/56 | Carman | 29—25.3 |
| 2,891,305 | 6/59 | Waltke | 29—206 |
| 2,980,991 | 4/61 | Frank | 29—203 |
| 3,057,051 | 10/62 | Frank et al. | 29—203 |
| 3,109,230 | 11/63 | Newton | 29—203 |

WHITMORE A. WILTZ, *Primary Examiner.*

THOMAS H. EAGER, *Examiner.*